US011444204B2

(12) United States Patent
Sharma et al.

(10) Patent No.: US 11,444,204 B2
(45) Date of Patent: Sep. 13, 2022

(54) TRANSISTOR DEVICE WITH CHANNEL RECESS STRUCTURE AND METHOD OF PROVIDING SAME

(71) Applicant: Intel Corporation, Santa Clara, CA (US)

(72) Inventors: Abhishek A. Sharma, Hillsboro, OR (US); Van H. Le, Beaverton, OR (US); Sean T. Ma, Portland, OR (US); Jack Kavalieros, Portland, OR (US); Benjamin Chu-Kung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 830 days.

(21) Appl. No.: 15/939,081

(22) Filed: Mar. 28, 2018

(65) Prior Publication Data

US 2019/0305101 A1 Oct. 3, 2019

(51) Int. Cl.
*H01L 29/786* (2006.01)
*H01L 29/49* (2006.01)
*H01L 29/423* (2006.01)
*H01L 29/66* (2006.01)
*H01L 27/12* (2006.01)

(52) U.S. Cl.
CPC ...... *H01L 29/7869* (2013.01); *H01L 27/1225* (2013.01); *H01L 29/42384* (2013.01); *H01L 29/4908* (2013.01); *H01L 29/66742* (2013.01); *H01L 29/78609* (2013.01); *H01L 29/78642* (2013.01); *H01L 29/78696* (2013.01)

(58) Field of Classification Search
CPC .......... H01L 29/78696; H01L 27/1225; H01L 29/7869; H01L 29/4908; H01L 29/42384; H01L 29/66742; H01L 29/78609
See application file for complete search history.

(56) References Cited

U.S. PATENT DOCUMENTS

2008/0166475 A1* 7/2008 Jeong .................. H01L 27/1225
427/126.3
2011/0001190 A1* 1/2011 Ide .................... H01L 29/78609
257/347

(Continued)

*Primary Examiner* — Feifei Yeung Lopez
(74) *Attorney, Agent, or Firm* — Essential Patents Group, LLP

(57) ABSTRACT

Techniques and mechanisms for improved performance characteristics of a transistor device. In an embodiment, a transistor of an integrated circuit comprises a source, a drain, a gate, a gate dielectric and a semiconductor structure which adjoins the gate dielectric. The semiconductor structure is configured to provide a conductive channel between the source and drain. The semiconductor structure includes first, second and third portions, the second portion between the source and the gate, and the third portion between the drain and the gate, wherein the first portion connects the second portion and third portion to one another. A thickness of the first portion is less than another thickness of one of the second portion or the third portion. In another embodiment, the locations of thicker portions of semiconductor structure mitigate overall transistor capacitance, while a thinner intermediary portion of the semiconductor structure promotes good sub-threshold swing characteristics.

4 Claims, 8 Drawing Sheets

(56) References Cited

U.S. PATENT DOCUMENTS

| | | | |
|---|---|---|---|
| 2012/0049190 A1* | 3/2012 | Miyairi | H01L 29/04 257/57 |
| 2016/0320674 A1* | 11/2016 | Seo | G02F 1/1368 |
| 2017/0229586 A1* | 8/2017 | Kim | H01L 29/78696 |

* cited by examiner

TRANSISTOR DEVICE WITH CHANNEL RECESS STRUCTURE AND METHOD OF PROVIDING SAME

BACKGROUND

1. Technical Field

Embodiments of the present invention generally relate to microelectronic devices and their methods of fabrication, and more particularly, but not exclusively, to the shape of a transistor structure which is operable to provide a conductive channel.

2. Background Art

Higher performance, lower cost, increased miniaturization of integrated circuit components, and greater packaging density of integrated circuits are ongoing goals in the microelectronic industry for the fabrication of microelectronic devices. As these goals are achieved, the microelectronic devices scale down (e.g., become smaller), which increases the need for optimal performance from each integrated circuit component, including managing transistor drive currents while reducing short-channel effects, parasitic capacitance, and off-state leakage.

One tendency in some circuit device architectures is that improvements to one aspect of device performance are achieved at the expense of some other aspect. As a result, there is an increasing premium placed on next-generation solutions that mitigate the tradeoff between performance characteristics of integrated circuitry.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
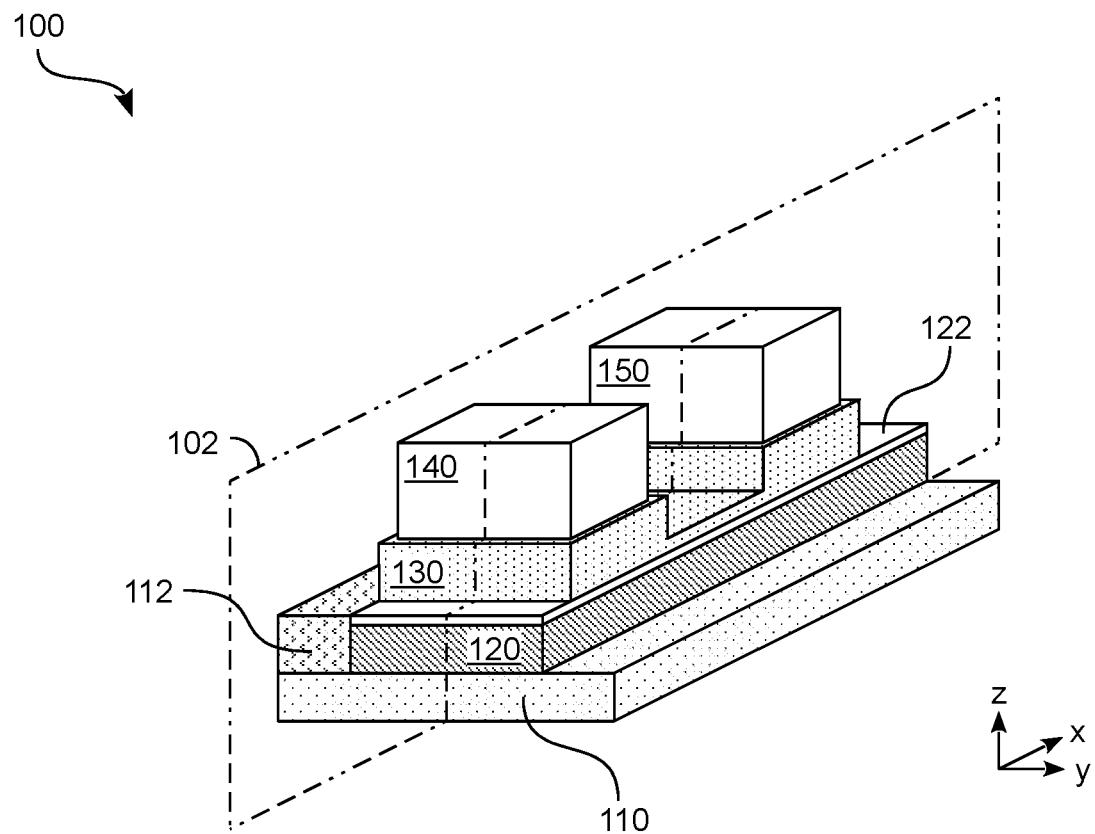
FIG. 1 shows a perspective view and a cross-sectional side view each of a semiconductor device according to an embodiment.
Figure 1:
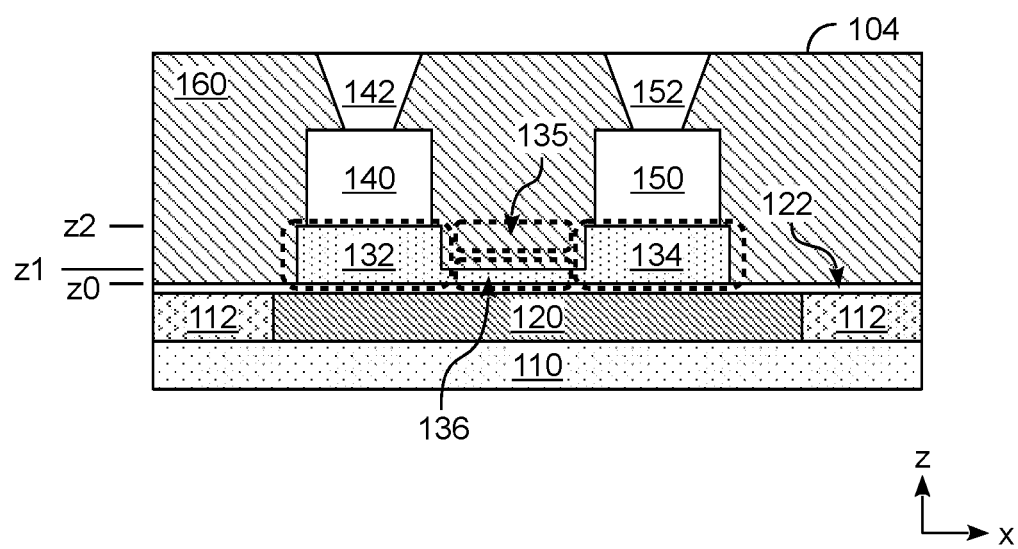

Embodiments discussed herein variously provide techniques and mechanisms for an integrated circuit transistor device to exhibit improved operational characteristics. In an embodiment, a transistor comprises source or drain structures and a channel structure which spans a region which extends between said source or drain structures. A first portion of the channel structure may be thicker than a second portion of the channel structure, wherein the first portion adjoins one of the source or drain structures, and wherein the second portion is in the region which extends between the source or drain structures. By providing such different thicknesses of a channel structure, various embodiments facilitate sub-threshold swing characteristics which are typically associated with thin channel structures, while avoiding an increase in capacitance that, in some architectures, might otherwise result from such thin channel structures.

As used herein, "source or drain structure" (or "SD structure") refers to a structure which is configured to function as one of a source of a device or a drain of the device. A SD structure may comprise at least a conductive service which provides a contact electrode that adjoins a semiconductor material. "Channel structure" refers herein to a structure of a device which, during operation of the device, may be used to selectively provide a conductive channel between two SD structures of the device. A contiguous body of one or more semiconductor materials (or "semiconductor structure" herein) may include or function as a channel structure. As used herein, "back-gate transistor" refers to a transistor which comprises a gate structure that, as compared to a SD structure of that same transistor, is relatively close to an underlying substrate. Such a gate structure may be disposed between the substrate and one or both of a source structure and a drain structure of the transistor.

Certain features of various embodiments are described herein with reference to a back-gate transistor, a channel structure of which has a first portion and second portion with different respective thicknesses. However, such description may be extended to additionally or alternatively apply to any of a variety of other types of transistors which include a channel structure having different thicknesses at various locations.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including one or more transistors of an integrated circuit.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

FIG. 1 shows a portion of an IC device 100 which includes transistor structures according to an embodiment. IC device 100 is one example of an embodiment wherein a semiconductor structure (also referred to herein as a "channel structure") provides a channel region of a transistor, wherein portions of the semiconductor structure have different respective thicknesses. A portion of said semiconductor structure—the portion disposed between a source or drain structure and a gate dielectric—may have additional capacitance due to the thickness thereof. However, said capacitance may be arranged in an in-series configuration with a capacitance of the gate dielectric. As compared to existing transistor designs, the total capacitance of the in-series configuration may be reduced where the capacitance of the channel structure portion is (due to its relative thickness) more closely matched to a capacitance of the gate dielectric.

As shown, IC device 100 includes a substrate 110, a dielectric 112 on substrate 110, and a gate structure 120 disposed in a recess which is formed at least in part by dielectric 112. Although structures of IC device 100 are variously shown as having respective rectilinear geometries, some or all such structures may instead have curved, obliquely angled, tapered and/or otherwise non-rectilinear shapes. Substrate 110 may be formed of any of a variety of materials that are suitable for use as a substrate of a semiconductor device, and in particular as a substrate for a back-gate (or other) transistor. Non-limiting examples of suitable materials that may be used as substrate 110 therefore include silicon (Si), germanium (Ge), silicon-germanium (SiGe), silicon-carbide (SiC), sapphire, a III-V semiconductor, a silicon on insulate (SOI) substrate, combinations thereof, and the like. Without limitation, in some embodiments substrate 110 is formed from or includes glass or single crystal silicon.

In some embodiments, one or more underlayers (not illustrated) may be deposited on substrate 110, e.g., such that they are present between substrate 110 and one or more of dielectric 112 and the materials forming gate structure 120. For example, one or more semiconductor base layers may be deposited on substrate 110. When used, such base layers may be pseudomorphic, metamorphic, or substantially lattice matched buffer and/or transition layers, as understood in the art. In any case, substrate 110 may be understood to provide an epitaxial seeding surface (e.g., a crystalline surface having a (100) or other suitable orientation) for the subsequent deposition of the materials thereon.

Dielectric 112 may be formed from any material that is suitable for use as an electrical insulator of a semiconductor device. Non-limiting examples of such materials include oxides, nitrides and alloys, such as but not limited to silicon oxide ($SiO_2$), silicon nitride (SiN), combinations thereof, and the like. Without limitation, in some embodiments dielectric 112 is $SiO_2$.

Gate structure 120 may be formed of any of a variety of suitable gate electrode materials. For example, gate structure 120 may comprise any of a variety of suitable conductors including, but not limited to, one of titanium nitride, tungsten, platinum, iridium, gold, ruthenium, a p-type doped polysilicon, zinc, or gallium. It is to be appreciated that gate structure 120 need not include a single material and may (for example) be a composite stack of thin films—e.g., wherein the stack forms a polycrystalline silicon/metal electrode or a metal/polycrystalline silicon electrode.

A transistor of IC device 100—e.g., a thin film transistor, or "TFT"—may comprise structures which are variously disposed over substrate 110 (e.g., including structures over dielectric 112 and/or over gate structure 120). For example, such a transistor may include—in addition to gate structure 120—a channel structure 130 and two source or drain ("SD") structures 140, 150 each adjoining a respective portion of channel structure 130. The transistor may further comprise a layer 122 which includes a dielectric material to provide at least some electrical insulation between gate structure 120 and a bottom side of channel structure 130. To protect the transistor, an insulator material 160 (e.g., including silicon dioxide or any of a variety of other dielectric materials) may be variously disposed on or around some or all of SD structures 140, 150, channel structures 130, dielectric 112 or the like. Connectivity to the transistor may be facilitated with one or more electrodes (e.g., including the illustrative electrodes 142, 152 shown) which extend at least in part through insulator material 160. In one example embodiment, electrodes 142, 152 each include copper disposed on a respective layer of tantalum nitride, titanium nitride, pure tantalum, pure titanium, or other such suitable material.

Gate dielectric layer 122 may comprise a high-K dielectric material which, for example, includes one or more of: HfO, AlO, $SiO_2$, SiN, AlN, silicon oxynitride, aluminum oxynitride, titanium oxide, titanium aluminum oxide, titanium hafnium oxide, zirconium oxide, titanium zirconium oxide, or aluminum zirconium oxide. In some embodiments, the dielectric material includes one or more of: Hf, Si, O, Zr, Al, or N—e.g., where gate dielectric layer 122 includes silicon dioxide.

SD structures 140, 150 may include any of a variety of conductors which, for example, are adapted from conventional transistor designs. By way of illustration and not limitation, a conductor of SD structures 140, 150 may include one of tungsten, tantalum nitride, titanium nitride, tantalum silicide, platinum, iridium, ruthenium, or cobalt. A conductive surface of SD structure 140 may be provided at an interface with portion 132—e.g., wherein a conductive surface of SD structure 150 is provided at an interface with portion 134. For example, portion 132 may adjoin a silicide, germanide, arsenide, metal or otherwise conductive surface of SD structure 140, wherein portion 134 similarly adjoins a conductive surface of SD structure 150. Although some embodiments are not limited in this regard, SD structures 140, 150 may each further comprise a respective semiconductor material—e.g., wherein one or each of SD structures 140, 150 comprises layers having different conductivity properties.

SD structures 140, 150 and channel structure 130 are configured to conduct current during operation of IC device 100—e.g., the current controlled using gate structure 120. For example, SD structures 140, 150 may be separated from one another (e.g., along the x-axis shown) by a distance which, in some embodiments, is in a range of 5 nanometers (nm) to 80 nm. Channel structure 130 may extend under and/or along this separation distance to variously adjoin respective portions of SD structures 140, 150. In such an embodiment, operation of IC device 100 may include an application of voltages at respective ones of SD structures 140, 150 and gate structure 120 to create a conductive channel in channel structure 130.

Channel structure 130 may be formed of any of a variety of suitable semiconductor materials including, but not limited to, one of Si, Ge, SiGe, GaAs, InSb, GaP, GaSb, InAlAs, InGaAs, GaSbP, GaAsSb, InP, GaN, and carbon nanotubes. In some embodiments, channel structure 130 comprises any of a variety of TFT materials which, for example, are adapted from conventional circuit designs. In some embodiments, channel structure 130 includes one of IGZO, ZO, GaO InO, IZO, AZO, or ITO. Alternatively or in addition, channel structure 130 may include one of poly Si, poly Ge, poly SiGe, a poly Group III-V material, tin oxide, (e.g., $SnO_2$ or SnO), cuprous oxide ($Cu_2O$), copper oxide (CuO), cobalt oxide, or any of various mixtures thereof.

To facilitate good sub-threshold swing characteristics, in combination with low overall transistor capacitance, some embodiments provide a channel structure which has different thicknesses at respective locations along a length said channel structure. For example, FIG. 1 also shows a cross-sectional side view 104 of IC device 100, wherein the x-z plane 102 shown corresponds to view 104. As illustrated in view 104, channel structure 130 may comprise portion 132, 134 which adjoin SD structures 140, 150 (respectively). Some or all of portion 132 may be between SD structure 140 and gate structure 120—e.g., wherein some or all of portion 134 is between SD structure 150 and gate structure 120. For example, a bottom side of SD structure 140 (the bottom side facing substrate 110) may have a footprint in a horizontal (x-y) plane. In such an embodiment, an area of an interface between SD structure 140 and portion 132 may be equal to at least 10% (e.g., at least 20% and, in some embodiments, at least 30%) of the area of the footprint. Alternatively or in addition, an area of an interface between SD structure 150 and portion 134 may occupy at least 10% of a corresponding footprint of SD structure 150.

Portion 132, 134 may be coupled to one another by at least some other portion of channel structure (such as the illustrative portion 136 shown) which, as compared to one or both of portions 132, 134, is relatively thin. By way of illustration and not limitation, one or both of portions 132, 134 may extend to each of two levels z0, z2 along the z-axis dimension (where z0 is some reference level such as that of a surface of layer 122). By contrast, at least some of portion 136 may have a smaller vertical span—e.g., wherein a height of portion 136 extends between z0 and some other level z1 which is between levels z0, z2. As a result, insulator material 160 may extend into a recess region 135 which is formed over portion 136.

In an embodiment, a thickness of portion 136 is equal to or less than 95% of the distance between heights z0, z2. For example, the thickness of portion 136 may be equal to or less than 90% (and in some embodiments, less than 80%) of said distance. In some embodiments, portion 136 extends along at least 5% of a total length of channel structure 130—e.g., wherein an average thickness of portion 136 is equal to or less than 95% of the distance between heights z0, z2.

A thickness (z-axis dimension) of channel structure 130 may, for example, be in a range of 2 nm to 40 nm—e.g., wherein one or both of a length (x-axis dimension) and a width (y-axis dimension) of channel structure 130 is/are in a range of 10 nm to 100 nm. In such an embodiment, respective thicknesses of SD structures 140, 150 may be in a range of 2 nm to 50 nm—e.g., wherein respective lengths and/or respective widths of SD structures 140, 150 are each in a range of 10 nm to 100 nm. In some embodiments, portion 132 may be self-aligned with SD structure 140 and/or portion 134 may be self-aligned to SD structure 150. Such self-alignment may be width respect to a length dimension, a width dimension or a combination thereof.

In one embodiment, a thickness of layer 122 is in a range of 1 nm to 30 nm. It is to be appreciated that a length of gate structure 120 may be greater than, equal to or even smaller than a length of channel structure 130. Similarly, a width of gate structure 120 may be greater than, equal to or even smaller than a width of channel structure 130. The respective lengths of gate structure 120 and layer 122 may vary significantly in different embodiments based on implementation-specific details (e.g., including the presence, proximity and configuration of any other circuit elements on substrate 110). It is to be appreciated that the above dimensions are merely illustrative, and may vary in different embodiments according to implementation-specific details.

Figure 2:
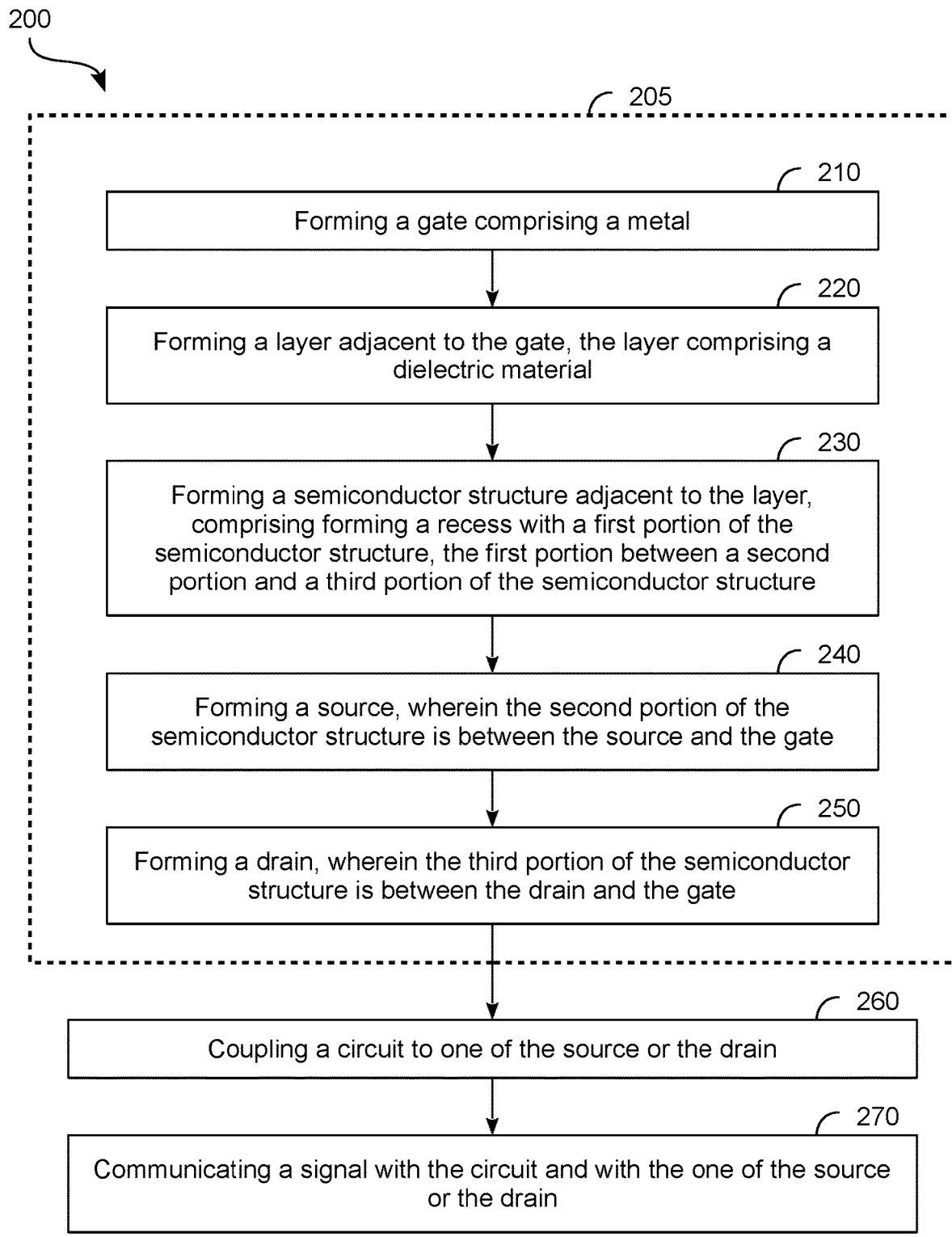
FIG. 2 illustrates a flow diagram illustrating elements of a method for fabricating structures of a semiconductor device according to an embodiment.

FIG. 2 shows features of a method 200 to provide functionality of an integrated circuit device according to an embodiment. Method 200 may fabricate some or all structures of IC device 100, for example. To illustrate certain features of various embodiments, method 200 is described herein with reference to structures which are variously shown in FIGS. 3A, 3B. However, method 200 may additionally or alternatively fabricate any of a variety of other transistor structures described herein, in various embodiments.

As shown in FIG. 2, method 200 may comprise operations 205 to fabricate a transistor comprising a channel structure, portions of which have various respective thicknesses. In an embodiment, operations 205 comprise (at 210) forming a gate comprising a metal, and (at 220) forming a layer adjacent to the gate, the layer comprising a dielectric material. The various forming at 210 and 220 may include masking, lithography, etching, deposition (e.g., chemical vapor deposition, atomic layer deposition or the like) and/or other operations which, for example, are adapted from conventional semiconductor fabrication techniques.

Figure 3A:
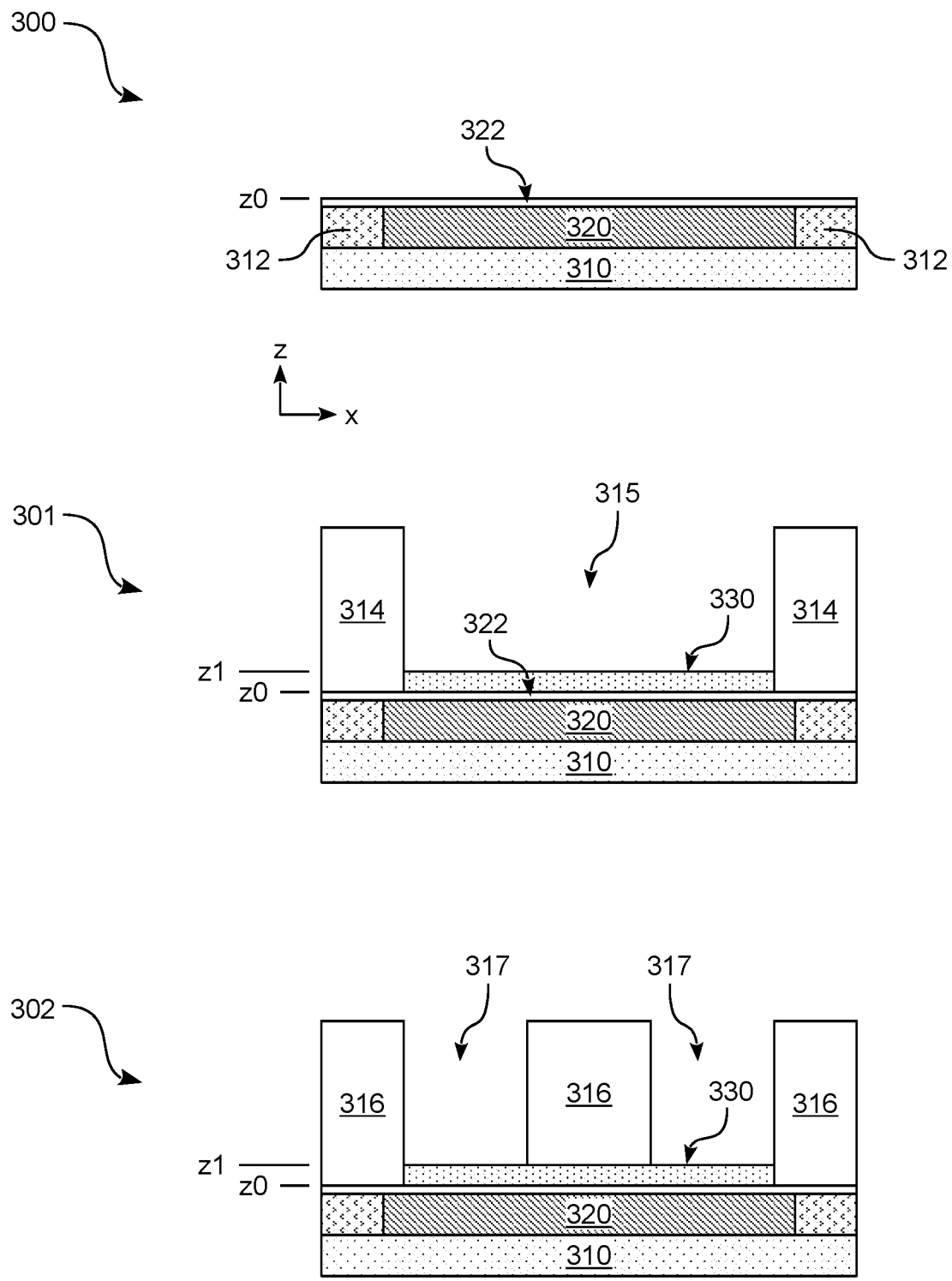
FIGS. 3A, 3B show cross-sectional views each of a respective stage of processing to fabricate structures of a semiconductor device according to an embodiment.
Figure 3B:
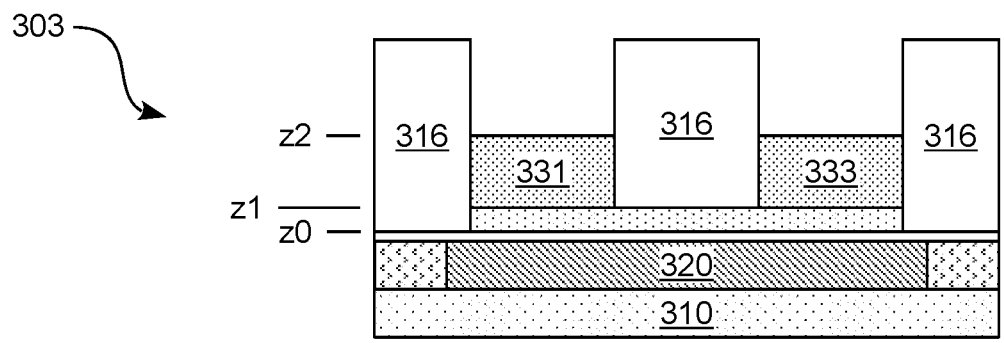
Figure 3B:
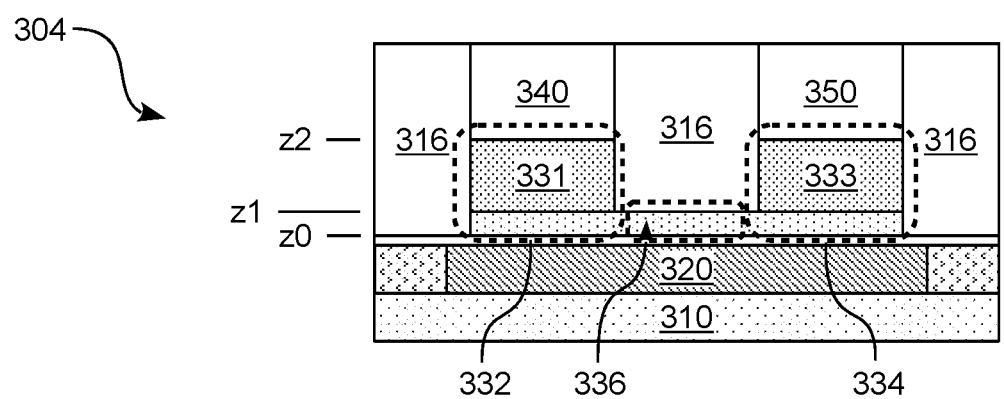
Figure 3B:
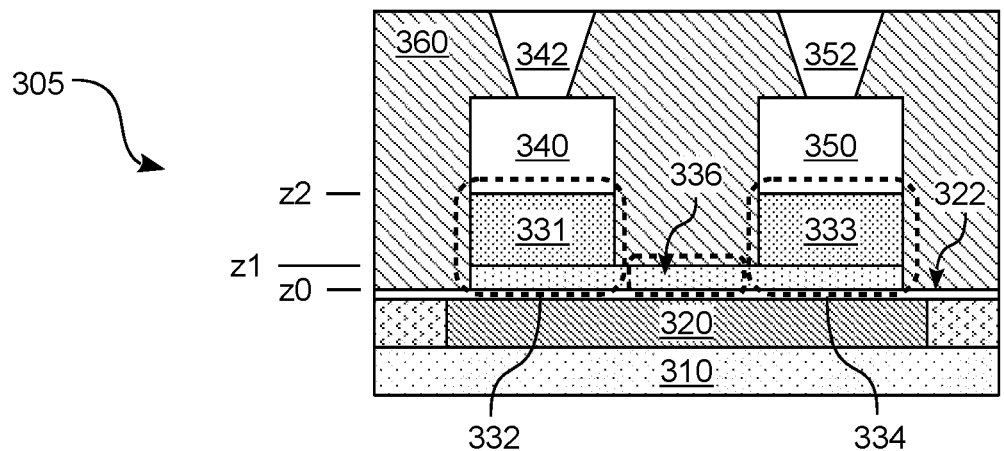

Referring now to FIGS. 3A, 3B, various respective cross-sectional views are shown for stages 300 through 305 of processing to fabricate transistor structures according to an embodiment. More particularly, for each of stages 300 through 305, corresponding structures during that stage are shown in a respective x-z plane cross-sectional view. The processing represented by stages 300 through 305 may include operations of method 200—e.g., wherein such processing is to fabricate a device having at least some features of IC device 100.

As shown at stage 300, a gate structure 320 may be disposed on a substrate 310, the gate structure 320 located in a recess which is formed at least in part by a dielectric 312. Substrate 310, dielectric 312 and gate structure 320 may correspond functionally to substrate 110, dielectric 112 and gate structure 120 (respectively), in one embodiment. The forming at 210 may include a selective deposition of one or more metal materials into such a recess to form gate structure 320. Such selective deposition may include one or more operations which, for example, are adapted from conventional techniques to fabricate a gate of a back-end (or other) transistor device. In such an embodiment, the forming of the layer at 220 may include—at stage 300—depositing at least on a surface of gate structure 320 a layer 322 of a dielectric material (such as that of layer 122). For example, layer 322 may be formed by depositing one or more layers of dielectric material via chemical vapor deposition (CVD), plasma enhanced CVD, or another suitable deposition process. The extent of layer 322 may be limited or otherwise defined by use of a patterned mask (not shown) during such deposition. To illustrate certain features of various embodiments, a height z0 of an upper surface of layer 322 is used as a reference height for describing one or more structures which are to be subsequently formed on layer 322.

Referring again to FIG. 2, method 200 may further comprise (at 230) forming a semiconductor structure adjacent to the layer. Such forming at 230 may comprise forming a recess with a first portion of the semiconductor structure, wherein the first portion is between a second portion of the semiconductor structure and a third portion of the semiconductor structure. The semiconductor structure formed at 230 may correspond functionally to channel structure 130. For example, the semiconductor structure may comprise a semiconductor material (such as that of channel structure 130) which includes oxygen and one of zinc, indium, gallium, or tin—e.g., wherein the material includes one of ZnO, InO, IGZO, GaO, or ITO.

In some embodiments, a first thickness of the first portion—e.g., portion 136—is equal to or less than 95% of a second thickness of one of the second portion or the third portion (such as one of portions 132, 134). For example, the first thickness may be equal to or less than 90% (and in some embodiments, less than 80%) of the second thickness. Alternatively or in addition, the transistor may be a thin film transistor, wherein a difference between a thickness of one of the second portion or the third portion and a thickness of the first portion is at least 1.0 nanometers (nm)—e.g., at least 3 nm and, in some embodiments, at least 5 nm.

The forming at 230 may comprise additive processing to variously build up different thicknesses of respective portions of the semiconductor structure. By way of illustration and not limitation, such additive processing may include forming a first patterned mask, wherein a first hole and a second hole each extend through the first patterned mask, and performing a first deposition of a first semiconductor material into each of the first hole and the second hole. In such an embodiment, the additive processing may further comprise forming a second patterned mask, wherein a third hole extends through the second patterned mask. A second deposition of a second semiconductor material may be performed through this third hole. The first deposition may be performed prior to the second deposition, although some embodiments are not limited in this regard. In some embodiments, a semiconductor body formed by the second deposition connects semiconductor bodies which are formed by the first deposition. The first semiconductor material may be different than (or alternatively, the same as) the second semiconductor material.

Referring again to FIGS. 3A, 3B, a patterned mask 314 may be formed directly or indirectly over one or both of dielectric 312 and some of layer 322 (as shown at stage 301). A hole 315, which is lithographically (or otherwise) formed by mask 314, may expose at least a portion of layer 322, the hole 315 allowing the deposition of a first semiconductor material to form a semiconductor body 330. In the example embodiments shown, semiconductor body 330 extends to a height z1 over layer 322.

Subsequently (as shown at stage 302), another patterned mask 316 may be formed directly or indirectly over at least some of semiconductor body 330—e.g., wherein portions of patterned mask 316 further extend over one or both of dielectric 312 and some of layer 322. Holes 317 formed by patterned mask 316 may leave portions of semiconductor body 330 exposed to a subsequent deposition processing. For example, as shown at stage 303, a second semiconductor material (e.g., the same as the first semiconductor material or, alternatively, a different semiconductor material) may be variously deposited through holes 317 and onto respective exposed portions of semiconductor body 330. Such deposition may result in the formation of semiconductor bodies 331, 333 each on a respective portion of semiconductor body 330. A material of semiconductor bodies 331, 333 may (as compared to semiconductor body 330, for example) have a relatively high concentration of donor elements. For example, semiconductor bodies 331, 333 may comprise a relatively indium rich IGZO, pure InO, fluorine doped InO, fluorine doped IGZO. In some embodiments, a dopant of semiconductor bodies 331, 333 includes one of fluorine, chlorine, bromine, nitrogen, or hydrogen. One or both of semiconductor bodies 331, 333 may extend to a height z2 which is above height z1. In combination with each other, the variously adjoining semiconductor bodies 330, 331, 333 may form a single contiguous semiconductor structure (e.g., channel structure 130).

Referring again to FIG. 2, method 200 may further comprise (at 240) forming a source, wherein the second portion of the semiconductor structure is between the source and the gate. In such an embodiment, method 200 may further comprise (at 250) forming a drain, wherein the third portion of the semiconductor structure is between the drain and the gate. The various forming at 240 and 250 may include selective mask, lithography, deposition, etching and/or other processes, one or more of which may be adapted from conventional semiconductor fabrication techniques.

Referring now to stage 304, the various forming at 240 and 250 may comprise, in one embodiment, SD structures 340, 350 being formed over semiconductor bodies 331, 333 (respectively). For example, a conductive material may be variously deposited into holes 317 of patterned mask 316. As a result, a portion 332 of the previously formed semiconductor structure is disposed between SD structure 340 and gate structure 320. Similarly, a portion 334 of the previously formed semiconductor structure may be disposed between SD structure 350 and gate structure 320. One or each of portions 332, 334 may be thicker than another portion 336 of the semiconductor structure, where portions 332, 334 are coupled to one another via portion 336.

Portion 332 includes semiconductor body 331 and a region of semiconductor body 330 which is between semiconductor body 331 and layer 322. Portion 334 includes semiconductor body 333 and another region of semiconductor body 330 which is between semiconductor body 333 and layer 322. Due at least in part to its increased thickness (e.g., as compared to that of portion 336), portion 332 may have a capacitance that is closer to that of an adjoining portion of layer 322. Since these two capacitances are arranged in series with each other, the overall capacitance of the in-series configuration may be smaller than it would be if—for example—portion 332 extended between height z0, z1. Similarly, portion 334 may have (due at least in part to its thickness) a capacitance that is more closely matched to that of an adjoining portion of layer 322, mitigating the overall capacitance of an in-series configuration of such capacitances. In addition to reducing overall transistor capacitance, some embodiments further enable good sub-threshold swing characteristics by providing a relatively thin portion 336 between SD structures 340, 350.

Referring again to FIG. 2, method 200 may (in some embodiments) additionally or alternatively comprise one or more operations which provide connectivity with and/or operation of a transistor device such as one resulting from operations 205. For example, method 200 may comprise (at 260) coupling a circuit to one of the source or the drain, and/or (at 270) communicating a signal with such a circuit and with the one of the source or the drain. For example, stages 300-304 may result in the formation of a transistor comprising gate structure 320, layer 322, SD structures 340, 350 and a semiconductor structure (comprising portions 332, 334, 336) which is to function as a channel structure for conducting a current between SD structures 340, 350. As shown at stage 305, an insulator material 360 may be deposited over SD structures 340, 350, over the semiconductor structure and/or other such circuit structures. Connectivity with such a transistor may be provided at least in part with electrodes 342, 352 which extend into insulator material 360 to couple to SD structures 340, 350 (respectively).

In some other embodiments, forming the semiconductor structure at 230 includes subtractive processing to remove some of a previously deposited semiconductor material. For example, the forming at 230 may comprise depositing a first semiconductor material on the layer of dielectric material, and subsequently performing an etch of the deposited first semiconductor material to expose a surface of the first portion.

Figure 4A:
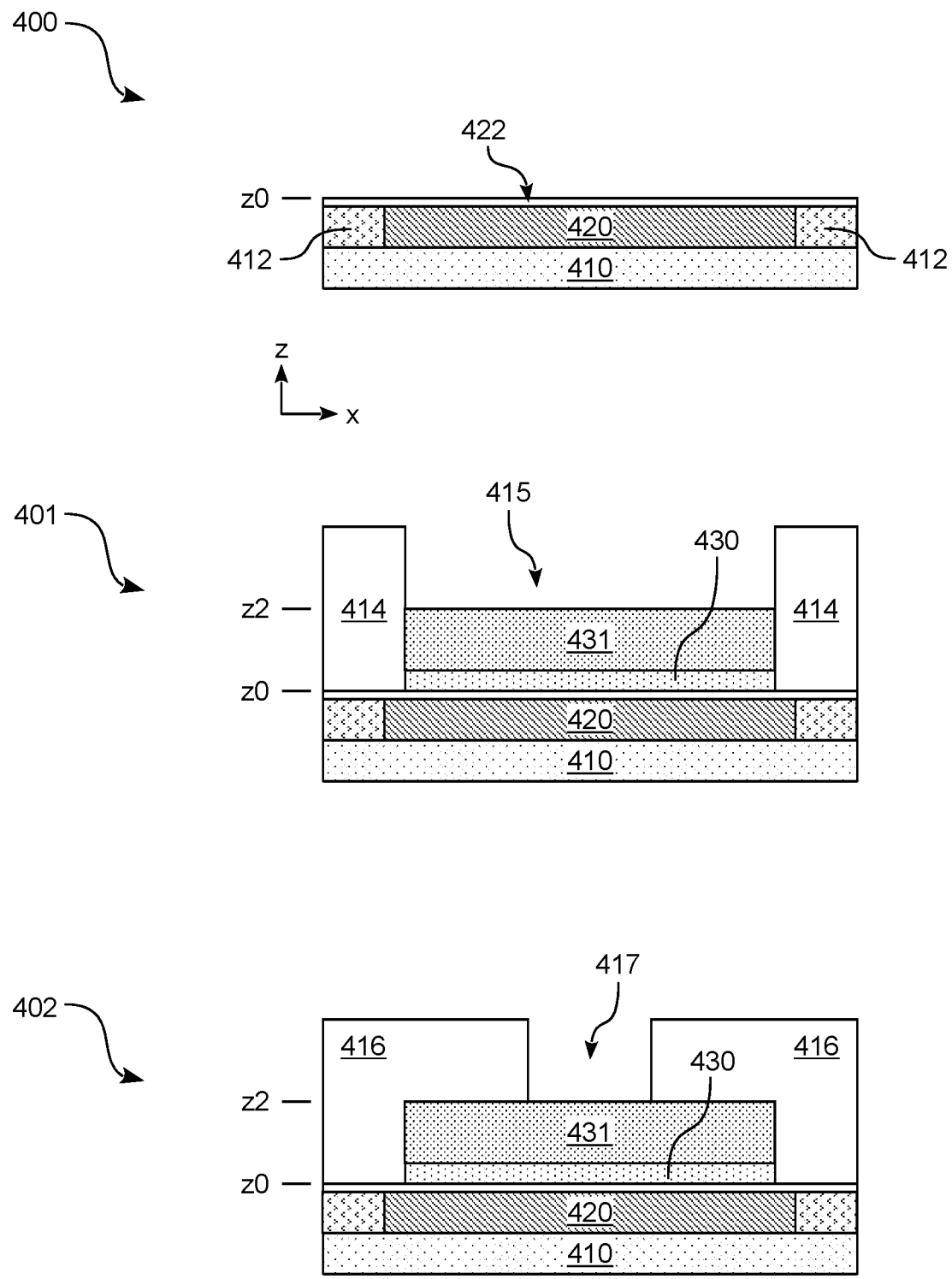
FIGS. 4A, 4B show cross-sectional views each of a respective stage of processing to fabricate structures of a semiconductor device according to an embodiment.
Figure 4B:
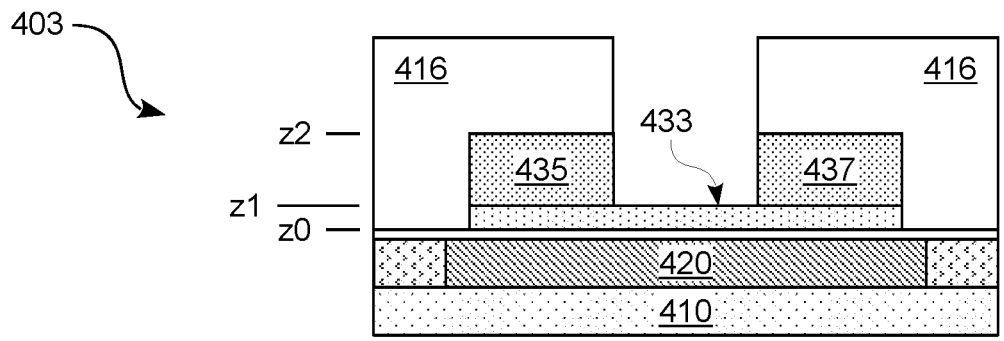
Figure 4B:
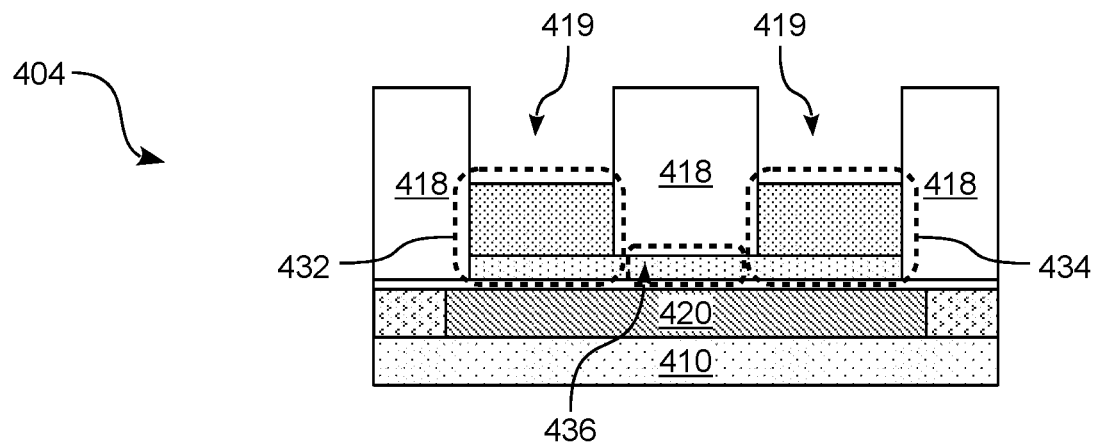
Figure 4B:
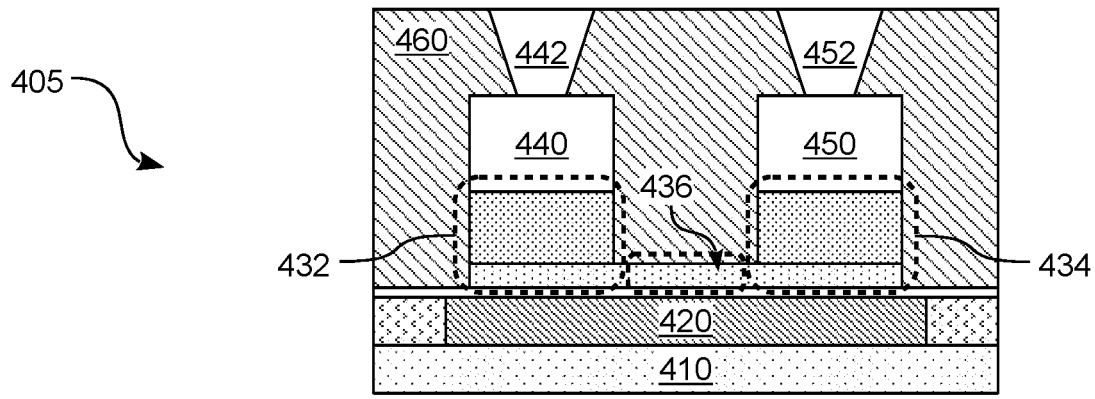

For example, FIGS. 4A, 4B, variously respective cross-sectional views for stages 400 through 405 of processing to fabricate transistor structures according to an embodiment. More particularly, for each of stages 400 through 405, corresponding structures during that stage are shown in a respective x-z plane cross-sectional view. The processing represented by stages 400 through 405 may include operations of method 200—e.g., wherein such processing is to fabricate a device having at least some features of IC device 100.

As shown at stage 400 (which may be similar to stage 300, for example), a dielectric 412 is disposed on a substrate 410, wherein a gate structure 420 is disposed in a recess which is formed at least in part by a dielectric 412. In such an embodiment, the forming of the layer at 220 may include depositing a layer 422 of a dielectric material (such as that of layer 122) on at least some surface portion of gate structure 420, wherein an upper surface of layer 422 is at a height z0. At stage 401, a patterned mask 414 may be formed directly or indirectly over one or both of dielectric 412 and some of layer 422. A hole 415 formed by mask 414 may expose at least a portion of layer 422, the hole 415 allowing the deposition of one or more semiconductor materials to form one or more semiconductor bodies (such as the illustrative semiconductor bodies 430, 431 shown). In the example embodiment shown, the one or more semiconductor bodies illustrated by bodies 430, 431 extend to a height z2 over layer 422. Semiconductor bodies 430, 431 may be formed by deposition of a single semiconductor material and a subsequent doping of a top portion of the deposited semiconductor material (e.g. where the doped region is represented as semiconductor body 431). Alternatively, semiconductor bodies 430, 431 may be formed by the sequential deposition of different respective semiconductor materials thereof.

Subsequently (as shown at stage 402), another patterned mask 416 may be formed over at least some of semiconductor bodies 430, 431—e.g., wherein a hole 417 in patterned mask 416 leaves a portion of semiconductor body 431 exposed to a subsequent deposition processing. For example, as shown at stage 403, any of a variety of dry etch or wet etch processes may be performed to remove some of semiconductor body 431, where such removal exposes a surface 433 of a remaining semiconductor body. Such etching may be performed with boron trichloride ($BCl_3$), chlorine ($Cl_2$), hydrogen chloride (HCl), hydrogen fluoride (HF), hydrogen bromide (HBr), tetramethylammonium hydroxide (TMAH) or any of various other etchants which, for example, are used in conventional semiconductor fabrication. At least some part of the surface 433 which is exposed by the etching may be at a height z1 between heights z0, z2—e.g., wherein semiconductor bodies 435, 437 are formed from respective remaining portions of semiconductor body 431.

Referring now to stage 404, a semiconductor structure resulting from the etching at stage 403 may include a portions 432, 434 and a portion 436 extending therebetween. One of each of portions 432, 434 may extend between heights z0, z2, wherein a height of at least some of portion 436 merely extends between heights z0, z1. Another patterned mask 418 may be subsequently formed over at least some of portion 436—e.g., wherein holes 419 formed by mask 418 leave at least some of portions 432, 434 exposed. As shown at stage 405, a semiconductor material may be variously deposited into holes 419 of patterned mask 418, where a dopant is introduced during or after such deposition. As a result, SD structures 440, 450 may be formed on portions 432, 434 (respectively). A configuration of portions 432, 434, 436 relative to SD structures 440, 450 and layer 422 may have some or all features of the configuration of portions 332, 334, 336 relative to SD structures 340, 350 and layer 322. An insulator material 460 may be deposited over portion 436, SD structures 440, 450 and/or other structures of the transistor. In such an embodiment, connectivity with the transistor may be provided at least in part with electrodes 442, 452 which extend into insulator material 460 to couple (respectively) to SD structures 440, 450.

Figure 5:
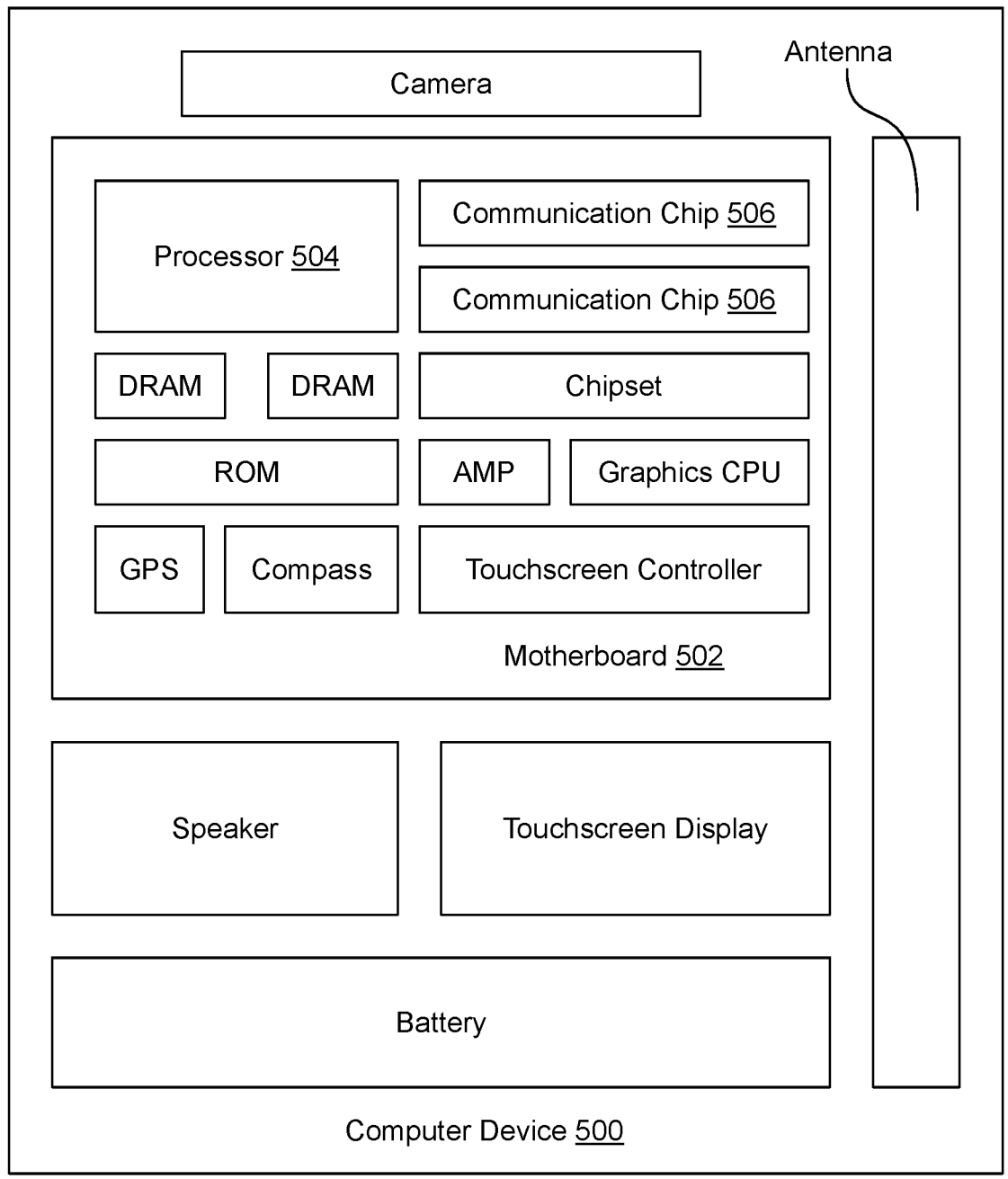
FIG. 5 illustrates a functional block diagram illustrating a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
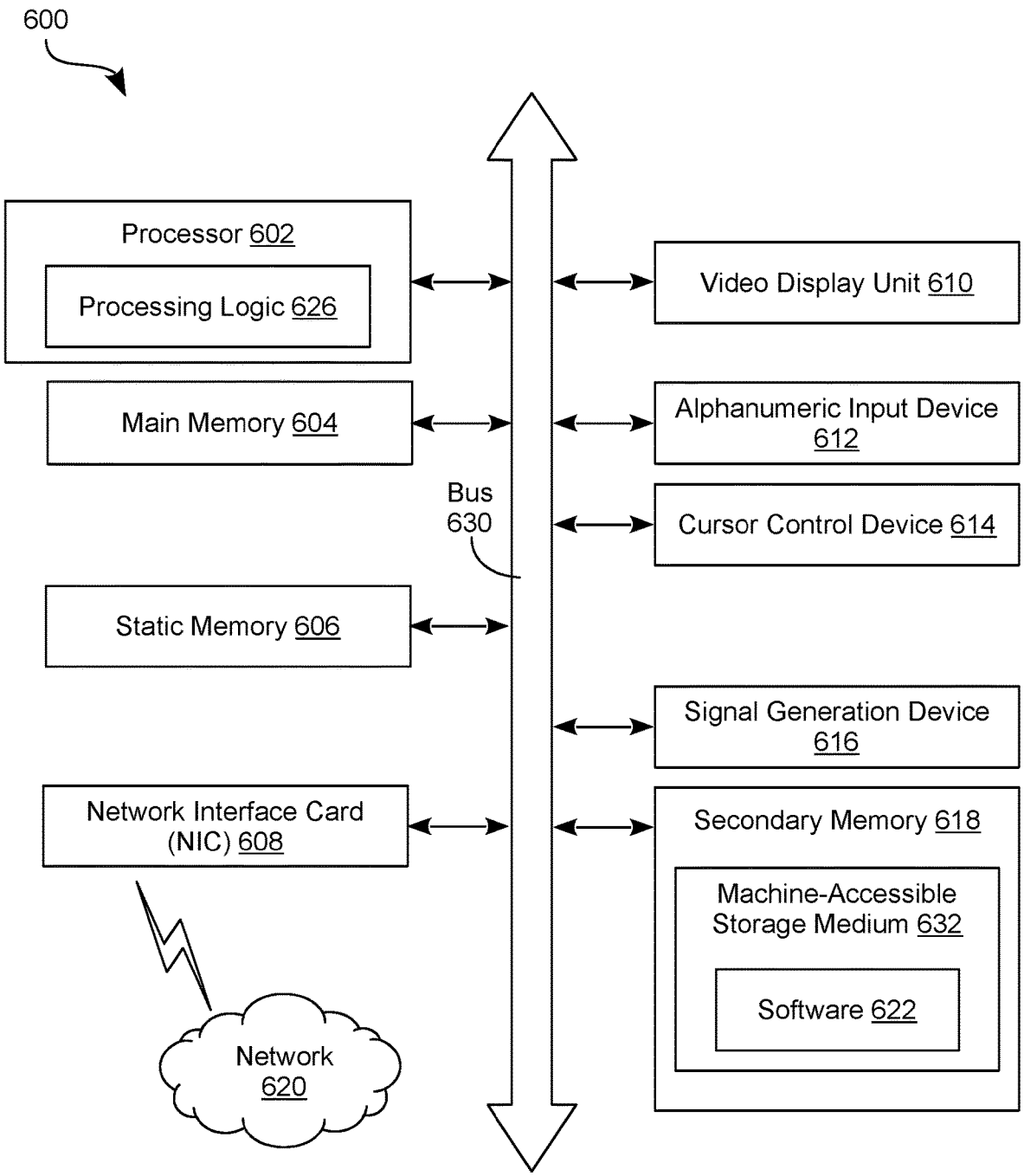
FIG. 6 illustrates a functional block diagram illustrating an exemplary computer system, in accordance with one embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for providing structures of a transistor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A method comprising:
   forming a gate of a single-gate transistor, the gate comprising a metal;
   forming a layer adjacent to the gate, the layer comprising a dielectric material;
   forming a semiconductor structure adjacent to the layer, the semiconductor structure comprising:
     a first body of a first semiconductor material, wherein the first semiconductor material is doped with a first dopant, wherein the layer extends between the first body and the gate, and wherein the first body forms at least in part a recess of the semiconductor structure, wherein a bottom of the recess is formed with a surface of the first body;
     a second body of a second semiconductor material other than the first semiconductor material, wherein the second semiconductor material is doped with a second dopant, wherein the first body extends between the second body and the layer; and
     a third body of the second semiconductor material, wherein the first body extends between the third body and the layer;
   forming a source of the single-gate transistor, wherein the second body of the semiconductor structure is between the source and the first body;
   forming a drain of the single-gate transistor, wherein the third body of the semiconductor structure is between the drain and the first body; and
   forming an insulator structure which, at the bottom of the recess, and at a top of the recess, extends horizontally across the recess to each of the second body and the third body;
   wherein:
     forming the semiconductor structure comprises:
       forming a first patterned mask, wherein a first hole and a second hole each extend through the first patterned mask;
       performing a first deposition into each of the first hole and the second hole;
       forming a second patterned mask, wherein a third hole extends through the second patterned mask; and
       performing a second deposition through the third hole, wherein a semiconductor body formed by the second deposition connects semiconductor bodies formed by the first deposition;
     a thickness of the first body is substantially the same in each of a first region under the second body, a second region under the third body, and a third region under the recess; and
     the thickness of the first body is less than 80% of a maximum height of one of the second body or the third body above the layer.

2. The method of claim 1, wherein a difference between a first thickness of one of the second body or the third body and a second thickness of the first body is at least 1.0 nanometers.

3. The method of claim 1, wherein the insulator structure fills the recess.

4. The method of claim 3, wherein the insulator structure extends from the recess to fill any region between the source and the drain.

* * * * *